(12) United States Patent
Clark (10) Patent No.: US 12,455,504 B2
(45) Date of Patent: Oct. 28, 2025

(54) METALORGANIC FILMS FOR EXTREME ULTRAVIOLET PATTERNING

(71) Applicant: Tokyo Electron Limited, Tokyo (JP)

(72) Inventor: Robert Clark, Fremont, CA (US)

(73) Assignee: Tokyo Electron Limited, Tokyo (JP)

( * ) Notice: Subject to any disclaimer, the term of this patent is extended or adjusted under 35 U.S.C. 154(b) by 625 days.

(21) Appl. No.: 17/748,686

(22) Filed: May 19, 2022

(65) Prior Publication Data

US 2022/0382159 A1   Dec. 1, 2022

Related U.S. Application Data

(60) Provisional application No. 63/192,893, filed on May 25, 2021.

(51) Int. Cl.
*G03F 7/20* (2006.01)
*G03F 7/004* (2006.01)
*G03F 7/16* (2006.01)

(52) U.S. Cl.
CPC .......... *G03F 7/2004* (2013.01); *G03F 7/0042* (2013.01); *G03F 7/0044* (2013.01); *G03F 7/167* (2013.01)

(58) Field of Classification Search
CPC ...... G03F 7/2004; G03F 7/0382; G03F 7/167; G03F 7/0045; G03F 7/0044
See application file for complete search history.

(56) References Cited

U.S. PATENT DOCUMENTS

| | | |
|---|---|---|
| 7,192,686 B2 | 3/2007 | Meagley |
| 8,465,903 B2 | 6/2013 | Weidman et al. |
| 8,536,068 B2 | 9/2013 | Weidman et al. |
| 9,778,561 B2 | 10/2017 | Marks et al. |
| 9,829,805 B2 | 11/2017 | Michaelson et al. |
| 9,996,004 B2 | 6/2018 | Smith et al. |
| 10,514,598 B2 | 12/2019 | Marks et al. |
| 10,727,075 B2 | 7/2020 | Kim et al. |

(Continued)

FOREIGN PATENT DOCUMENTS

| | | |
|---|---|---|
| TW | 202006168 A | 2/2020 |
| WO | 2019217749 A1 | 11/2019 |

(Continued)

OTHER PUBLICATIONS

Cardineau et al., "EUV Resists based on Tin-Oxo Clusters," Advances in Patterning Materials and Processes XXXI, Proc. of SPIE vol. 9051, pp. 90511B-1-90511B-12, Downloaded From: http://proceedings.spiedigitallibrary.org/ on May 20, 2015 Terms of Use: http://spiedl.org/terms, 12 pages.

(Continued)

*Primary Examiner* — Mark F. Huff
*Assistant Examiner* — Kevin J Drummey
(74) *Attorney, Agent, or Firm* — Slater Matsil, LLP (57) ABSTRACT

A method of processing a substrate that includes: forming, over the substrate placed in a process chamber, an extreme ultraviolet (EUV)-active photoresist film including a tin alkenoxide moiety by exposing the substrate to a tin-containing precursor and exposing the substrate to an oxygen-containing precursor that reacts with the tin from the tin-containing precursor to form the tin alkenoxide; and patterning the EUV-active photoresist film by exposing the substrate to an EUV irradiation.

20 Claims, 8 Drawing Sheets

(56) References Cited

U.S. PATENT DOCUMENTS

| | | | |
|---|---|---|---|
| 10,732,505 | B1 | 8/2020 | Meyers et al. |
| 10,831,096 | B2 | 11/2020 | Marks et al. |
| 2014/0235796 | A1 | 8/2014 | Ogihara et al. |
| 2015/0056542 | A1 | 2/2015 | Meyers et al. |
| 2015/0079393 | A1* | 3/2015 | Freedman ............. G03F 7/0042 546/10 |
| 2015/0221519 | A1 | 8/2015 | Marks et al. |
| 2017/0102612 | A1 | 4/2017 | Meyers et al. |
| 2018/0004083 | A1 | 1/2018 | Marks et al. |
| 2018/0046086 | A1* | 2/2018 | Waller ................ H01L 21/0273 |
| 2019/0212656 | A1 | 7/2019 | Dai et al. |
| 2019/0302615 | A1* | 10/2019 | Krysak ................ G03F 7/0043 |
| 2021/0013034 | A1 | 1/2021 | Wu et al. |
| 2021/0080832 | A1* | 3/2021 | Ouyang .................... G03F 7/26 |

FOREIGN PATENT DOCUMENTS

| | | | |
|---|---|---|---|
| WO | 2020172481 A1 | 8/2020 | |
| WO | WO-2021072042 A1 * | 4/2021 | ............. C23C 16/30 |

OTHER PUBLICATIONS

Hinsberg et al., "A Numeric Model for the Imaging Mechanism of Metal Oxide Euv Resists," Inpria, EUVL Workshop, 2018, 21 pages.

Ober et al., "EUV photolithography: resist progress and challenges," Extreme Ultraviolet (EUV) Lithography IX, Proc. of SPIE vol. 10583, pp. 1058306-1-1058306-13, Downloaded From: https://www.spiedigitallibrary.org/conference-proceedings-of-spie on Sep. 15, 2021, 14 pages.

Sharps et al., "Implications of Crystal Structure on Organotin Carboxylate Photoresists," Crystal Research & Technology, vol. 52, Issue 10, Jul. 24, 2017, pp. 1-7.

International Searching Authority, "Notification of Transmittal of The International Search Report and The Written Opinion of The International Searching Authority, or the Declaration," International Application No. PCT/US2022/029984, mail date Sep. 13, 2022, 11 pages.

* cited by examiner

METALORGANIC FILMS FOR EXTREME ULTRAVIOLET PATTERNING

CROSS-REFERENCE TO RELATED APPLICATIONS

This application claims the benefit of U.S. Provisional Application No. 63/192,893, filed on May 25, 2021, which application is hereby incorporated herein by reference.

TECHNICAL FIELD

The present invention relates to the field of semiconductor manufacturing and semiconductor devices, and more particularly, to metalorganic films for EUV patterning.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure.

Photolithography is commonly used to pattern thin films during semiconductor processing, where photons are emitted from a light source onto a photosensitive photoresist to initiate a chemical reaction in the photoresist. Thereafter, the photoresist is developed and exposed or unexposed portions of the photoresist are removed to form a pattern or a mask. Extreme ultraviolet (EUV) radiation can be used for providing improved pattern resolution in advanced integrated circuits where reduction in feature sizes is required. Common EUV photoresists are polymer-based chemically amplified resists (CARs) that are deposited on substrates using liquid-based spin-on techniques that consume a significant amount of complex precursors at very high cost.

SUMMARY

In accordance with an embodiment of the present invention, a method of processing a substrate that includes: forming, over the substrate placed in a process chamber, an extreme ultraviolet (EUV)-active photoresist film including a tin alkenoxide moiety by exposing the substrate to a tin-containing precursor and exposing the substrate to an oxygen-containing precursor that reacts with the tin from the tin-containing precursor to form the tin alkenoxide; and patterning the EUV-active photoresist film by exposing the substrate to an EUV irradiation.

In accordance with an embodiment of the present invention, a method of processing a substrate, the method that includes: forming, over the substrate placed in a process chamber, an extreme ultraviolet (EUV)-active photoresist film including a tin alkoxide, a tin aryloxide, or a tin carboxylate moiety by exposing the substrate to a tin-containing precursor and exposing the substrate to an oxygen-containing precursor that reacts with the tin from the tin-containing precursor to form the tin alkoxide, the aryloxide ligand, or the tin carboxylate; and patterning the EUV-active photoresist film by exposing the substrate to an EUV irradiation.

In accordance with an embodiment of the present invention, a method of forming an extreme ultraviolet (EUV)-active photoresist film over a substrate that includes: exposing the substrate to a tin-containing precursor; exposing the substrate to an oxygen-containing precursor to form the EUV-active photoresist film including tin and oxygen; and incorporating a photoacid generator (PAG) into the EUV-active photoresist film, where the incorporating being performed during or after forming the EUV-active photoresist film.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1D illustrate cross-sectional views of an example substrate during a fabrication process for forming a metalorganic film on the substrate followed by EUV lithographic patterning in accordance with various embodiments, wherein

FIGS. 3-5 illustrate example processing systems for depositing a metalorganic film on a substrate in accordance with various embodiments, wherein

FIGS. 6A-6C illustrate process flow charts of methods of formation of a metalorganic film on a substrate in accordance with various embodiments, wherein

DETAILED DESCRIPTION OF ILLUSTRATIVE EMBODIMENTS

Extreme ultraviolet (EUV) lithography can extend current photolithographic technology beyond its optical limits by moving to smaller imaging source wavelengths to pattern small critical dimension features. EUV light sources at approximately 13.5 nm wavelength can be used for leading-edge lithography tools, also referred to as scanners. The EUV radiation is strongly absorbed in a wide range of solid materials and gases and therefore the radiation paths need to operate in a vacuum to avoid absorption by ambient gases such as $H_2O$ and $O_2$.

EUV lithography typically makes use of an organic hardmask (e.g., an ashable hardmask of plasma-enhanced chemical vapor deposition (PECVD) amorphous hydrogenated carbon) that is patterned using a conventional photoresist process. During photoresist exposure, EUV radiation is absorbed in the resist and in the substrate below, producing highly energetic photoelectrons (about 100 eV) and in turn a cascade of low-energy secondary electrons (about 10 eV) that diffuse laterally by several nanometers. These electrons increase the extent of chemical reactions in the resist that increases its EUV dose sensitivity. However, a secondary electron pattern that is random in nature is superimposed on the optical image. This unwanted secondary electron exposure results in loss of resolution, observable line edge roughness (LER) and linewidth variation in the patterned resist. These defects are replicated in the material to be patterned during subsequent pattern transfer etching.

Metal oxide materials (e.g., containing tin (Sn) metal) have been found to be particularly suitable for direct EUV photopatterning as they strongly absorb EUV radiation. Unlike an insulator such as conventional polymer-based chemically amplified resists (CARs), a metal oxide material is less susceptible to secondary electron exposure effects since the secondary electrons can quickly lose energy and thermalize by scattering with conduction electrons.

Embodiments of this disclosure describe methods for depositing a metalorganic film containing tin (Sn) metal, where the metalorganic film comprises a network of metal oxide and may be used as a photoresist for EUV patterning in manufacturing of integrated circuits. The metalorganic film may further include additional chemical elements such as halogen. According to one embodiment, a EUV-sensitive metalorganic film may be vapor-deposited on a semiconductor substrate. According to another embodiment, a EUV-sensitive metalorganic film may be deposited on a semiconductor substrate using liquid exposures. The metalorganic film may then be patterned by an EUV exposure under vacuum conditions, followed by development of the pattern, and removal of exposed or unexposed portions of the metalorganic film by a dry etch or a wet etch process to form a metalorganic mask on the substrate. The formed metalorganic mask may then be used for patterning underlying layers on the substrate by a pattern transfer etch.

The methods described in this disclosure may advantageously enable a metal-containing EUV-sensitive photoresist having a high EUV absorbance and thereby better resist sensitivity compared to conventional CARs. The higher EUV absorbance may enable decreasing the thickness of the photoresist required for an acceptable performance. The metal-containing EUV-sensitive photoresist described in this disclosure may also advantageously exhibit an etch resistance better than conventional CARs after exposure and a more uniform or homogenous chemical composition than CARs, both of which may be beneficial in mitigating issues of blur or line edge roughness.

Figure 2:
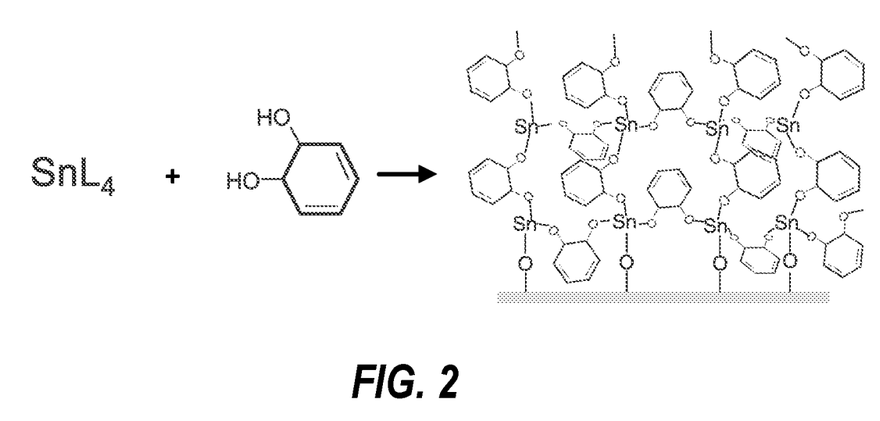
FIG. 2 illustrates an example reaction of a metal-containing precursor and an oxygen-containing precursor to form a metalorganic film in accordance with various embodiments.
Figure 3:
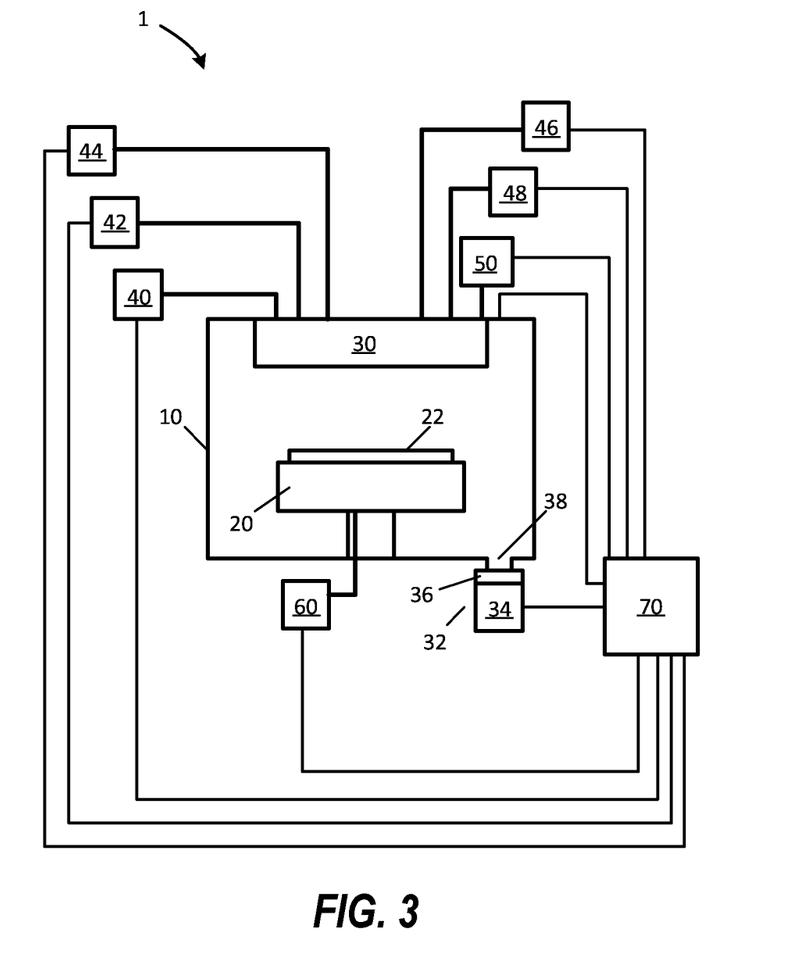
FIG. 3 illustrates a processing system for a chemical vapor deposition (CVD) or atomic layer deposition (ALD) process in accordance with one embodiment.
Figure 4:
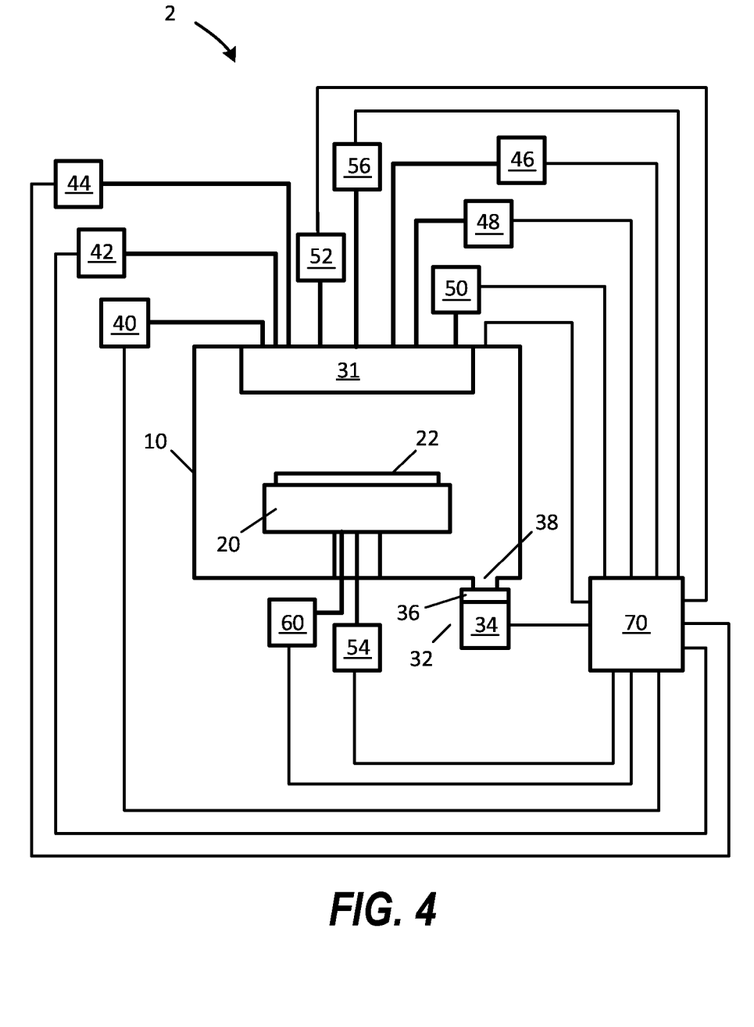
FIG. 4 illustrates a plasma processing system for a plasma-enhanced CVD (PECVD) or plasma-enhanced ALD (PEALD) process in accordance with another embodiment.
Figure 5:
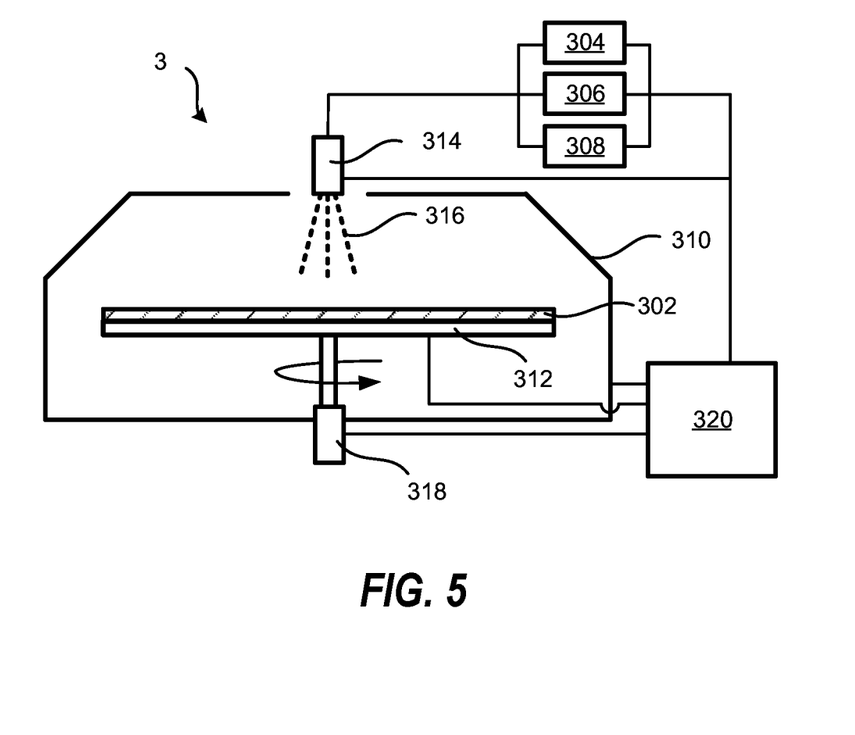
FIG. 5 illustrates a liquid-based spin-on deposition system in accordance with yet another embodiment.

In the following, steps of an example fabrication process including formation, patterning, and development of the metalorganic film as a EUV-sensitive photoresist film are first described referring to FIGS. 1A-1D. Next, an example reaction to form the metalorganic film is illustrated in FIG. 2. FIGS. 3-5 then illustrate example processing systems for forming and depositing the metalorganic film on a substrate. Exemplary process flow diagrams are described referring to FIGS. 6A-6C in accordance with various embodiments. All figures are drawn for illustration purpose only and not to scale.

FIGS. 1A-1D illustrate cross-sectional views of an example substrate 100 during a fabrication process for forming a metalorganic film on the substrate followed by EUV lithographic patterning in accordance with various embodiments.

Figure 1A:
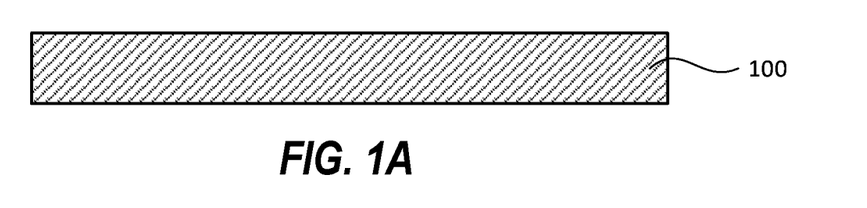
FIG. 1A illustrates the incoming substrate.

FIG. 1A illustrates a cross-sectional view of the substrate 100 to be patterned. For example, the substrate 100 may be a silicon wafer having a diameter of 150 mm, 200 mm, 300 mm, or 450 mm. In various embodiments, the substrate 100 may be a part of, or include, semiconductor device, and may have undergone a number of steps of processing following, for example, a conventional process. The substrate 100 accordingly may comprise layers of semiconductors useful in various microelectronics. For example, the semiconductor structure may comprise the substrate 100 in which various device regions are formed.

In one or more embodiments, the substrate 100 may be a silicon wafer, or a silicon-on-insulator (SOI) wafer. In certain embodiments, the substrate 100 may comprise silicon germanium, silicon carbide, gallium arsenide, gallium nitride, or other compound semiconductors. In other embodiments, the substrate 100 comprises heterogeneous layers such as silicon germanium on silicon, gallium nitride on silicon, silicon carbon on silicon, as well layers of silicon on a silicon or SOI substrate. In various embodiments, the substrate 100 is patterned or embedded in other components of the semiconductor device.

Figure 1B:
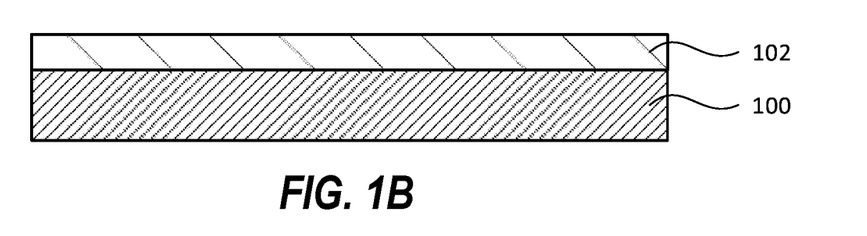
FIG. 1B illustrates the substrate after the deposition of the metalorganic film over the substrate.

FIG. 1B illustrates a cross-sectional view of the substrate 100 after depositing a metalorganic film 102 over the substrate 100.

As illustrated in FIG. 1B, the metalorganic film 102 may be formed on the surface of the substrate 100 in one example. In various embodiments, although not illustrated, the substrate 100 may further comprise various layers useful for semiconductor device fabrication, which may be collectively regarded as a part of the substrate 100 in this disclosure. For example, in certain embodiments, over the substrate 100, there may a dielectric layer comprising a silicon-based dielectric material with a low dielectric constant (i.e., low-k value) such as organosilicate glass (SiCOH), dense SiCOH, porous SiCOH, and other porous dielectric materials. Further, there may be a hard mask layer over the substrate 100, which may be patterned in subsequent etch processes after the EUV photopatterning. In various embodiments, the hard mask may comprise titanium nitride, titanium, titanium oxide, tantalum, tungsten carbide, other tungsten based compounds, ruthenium based compounds, or aluminum based compounds. The hard mask may also be carbon-based or silicon-based mask materials. In addition, the metalorganic film 102 may be formed as a part of a tri-layer stack commonly used for photolithographic patterning. The tri-layer stack may be used to generate and transfer a pattern to the hard mask and then, for example, underlying layers such as the dielectric layer of the substrate 100. In various embodiments, the tri-layer stack may comprise a bottom layer, a middle layer, and the metalorganic film 102 as an EUV-sensitive photoresist. In one or more embodiments, the bottom layer may comprise carbon materials and may be formed via a spin-on process or vapor deposition such as CVD. The middle layer may comprise silicon-based materials, including but not limited to spin-on glass (SOG), silicon carbide, silicon oxide, silicon oxycarbide, silicon oxynitride, silicon nitride, tin oxide, and bottom anti-reflective coating films (BARC). The middle layer 230 may also be formed by a spin-on process or vapor deposition such as CVD. For illustration purpose, FIGS. 1A-1D illustrates only the metalorganic film 102 directly deposited on the substrate 100, but as described above, any suitable multi-layer structure may be present as a part of the substrate 100 in various embodiments.

In various embodiments, the metalorganic film 102 may comprise tin (Sn). In certain embodiments, the metalorganic film 102 may be a network of metal oxide comprising a metal alkoxide, metal alkenoxide, metal aryloxide, or metal carboxylate group. These groups bonded to the metal are generally represented by chemical formulas, —OR, —OR', —OAr, and —OOCR, respectively, where R is an alkyl group, R' is an alkene group, and Ar is an aryl group. In various embodiments, the metalorganic film 102 is a polymeric film, and may not have a highly ordered structure such as crystalline. The number of the above functional groups bonded to the metal atom may differ for each metal atom, ranging between 1 and 4. The deposition of the metalorganic film 102 may be performed by a dry or wet process. In various embodiments, the metalorganic film 102 may be deposited by vapor deposition, for example chemical vapor deposition (CVD), plasma-enhanced CVD (PECVD), atomic layer deposition (ALD), or plasma-enhanced ALD (PEALD).

In certain embodiments, the deposition process for the metal organic film 102 may comprise exposing the substrate 100 to two precursors in a process chamber: a tin-containing precursor and an oxygen-containing precursor. The exposures to these precursors may be performed stepwise or simultaneously. In various embodiments, the deposition process may be an ALD or pseudo-ALD process and comprise two or more exposing steps. For example, the deposition process may be performed by first exposing the substrate 100 to the tin-containing precursor that forms an adsorbed layer on the substrate 100 and, thereafter, exposing the substrate 100 to the oxygen-containing precursor gas that reacts with the adsorbed tin-containing precursor. The exposing steps may be repeated one or more times to increase a thickness of the metalorganic film 102 on the substrate 100. In certain embodiments, the exposing steps may be separated temporally or spatially. Temporally separating the exposing steps may be realized by changing the gas composition in a process chamber. On the other hand, spatially separating the exposing steps may be enabled by utilizing multiple spatially segregated sections within the process chamber and transporting the substrate from one section to another. For temporally separating the exposing steps even better, the vapor deposition may further include evacuating, purging, or both evacuating and purging, the process chamber between the exposing steps. These additional steps may be beneficial in ensuring the reaction occurs only on surface and not in the gas phase. The ALD or pseudo-ALD method in accordance with this embodiment may be particularly advantageous in enabling layer-by-layer growth of the metalorganic film 102 with a high uniformity.

In another embodiment, instead of the ALD type process, the precursors may be supplied in the process chamber simultaneously to grow the metalorganic film 102. Such an embodiment may be advantageous by allowing the continuous growth of the metalorganic film 102 in a single step. In this embodiments, the reaction between the precursors may or may not occur in the gas phase as well as on surface.

In other embodiments, the metalorganic film 102 may be deposited by liquid deposition using alternate exposures of a tin-containing precursor liquid and an oxygen-containing precursor liquid. The liquid deposition may further include rinsing the substrate with a rinsing solution to remove an excess amount and/or unreacted portion of the precursors between the exposing steps. The rinsing solution may comprise deionized water, common organic solvents such as acetone, propylene glyclol monomethyl ether acteate, 1-Methoxy-2-propanol, methyl isobutyl carbinol, hexane, tert-butanol and isopropanol, or mixtures thereof. In another embodiment, the liquid precursors may be mixed first and the mixture solution may be applied to the substrate to grow the metalorganic film 102. In one or more embodiments, one of the precursors may be gaseous and another of the precursors may be liquid, and accordingly two different modes (vapor and liquid) of delivery may be utilized to perform the deposition process.

In various embodiments, after forming the metalorganic film 102 over the substrate 100, an optional post-apply bake may be performed to remove any excess solvents from a wet process, residual volatile byproducts from a dry process, or both.

Figure 1C:
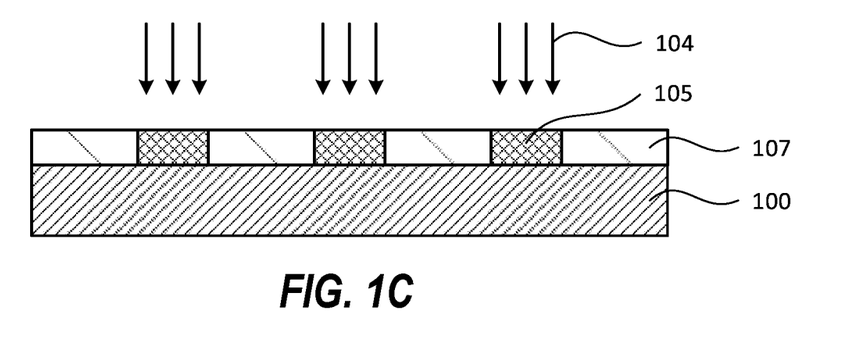
FIG. 1C illustrates the substrate after an EUV exposure.

FIG. 1C illustrates a cross-sectional view of the substrate 100 after an EUV exposure.

The method further includes, as schematically illustrated in FIG. 1C, exposing the substrate 100 to an EUV light pattern 104. A photomask may be used to create the EUV light pattern 104. In response to the exposure to the EUV light pattern 104, a photoreaction may occur in exposed regions 105 of the metalorganic film 102, while unexposed regions 107 remain unchanged. As a result of the photoreaction, the exposed regions 105 may comprise a cross-linked metalorganic film, which may have material properties substantially different from the unreacted portion of the metalorganic film 102 (i.e., the unexposed regions 107). Such a difference in the material properties includes volatility, reactivity, and/or solubility among others, which gives origin to the tonality as a photoresist.

In one or more embodiments, as further described below, the metalorganic film 102 may also contain a photoacid generator (PAG) that releases a photoacid in response to the EUV exposure. The generated photoacid can induce further chemical reactions in the metalorganic film 102, which may improve the tonality.

Figure 1D:
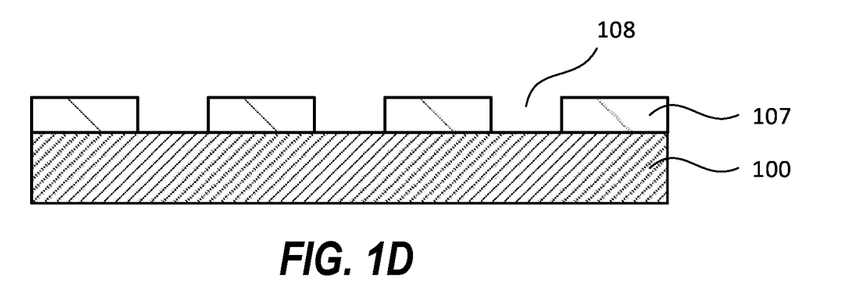
FIG. 1D illustrates the substrate after a developing step.

FIG. 1D illustrates a cross-sectional view of the substrate after a developing step.

In FIG. 1D, the exposed regions 105 are developed and removed by a dry etch or a wet etch process to form a patterned metalorganic mask containing the unexposed regions 107 and openings 108 that expose the underlying substrate 100. Conventionally, a photoresist may be removed in a wet process by treating the substrate with a developing solution to dissolve the reacted (in case of a positive tone resist) or unreacted (in case of a negative tone resist) regions of the photoresist. A similar wet process may be applied for the development of the metalorganic film 102 in various embodiments. Alternately, a dry process may be used in other embodiments. The dry process may comprise, for example, a selective plasma etch process or a thermal process, advantageously eliminating the use of a developing solution. In certain embodiments, the dry process may be performing using reactive ion etching (RIE) process or atomic layer etching (ALE) Thereafter, the openings 108 may be used in an etching process to etch features in the substrate 100. In certain embodiments, dry processes for the formation and developing of the metalorganic film 102 may allow better process control at the nanoscale than a wet process, e.g., for forming features that are a few nanometers or sub-nanometer in critical dimension.

In various embodiments, after the EUV exposure (FIG. 1C) and prior to the developing step (FIG. 1D), an optional post-exposure bake (PEB) may be performed to further differentiate the material properties between the exposed regions 105 and the unexposed regions 107. In certain embodiments, the PEB may be performed by heating the substrate 100 in a process chamber at a temperature between 70° C. to 250° C., for example between 180° C. to 225° C. in one embodiment, in vacuum or under a gas flow.

In the embodiments described above referring to FIGS. 1A-1D, the metalorganic film 102 is a negative-tone photoresist. In other embodiments, the metalorganic film 102 may form a positive-tone photoresist, where the exposed regions 105 may be removed by the developing step and the unexposed regions 107 remain. In one embodiment, the positive-tone photoresist may be enabled by performing an additional chemical treatment such as polymerization to increase an etch resistance of the unexposed regions 107 after the EUV exposure, while the photoreaction in the exposed regions 105 reduces the etch resistance.

FIG. 2 illustrates an example reaction of a metal-containing precursor and an oxygen-containing precursor to form a metalorganic film in accordance with various embodiments.

The metal-containing precursor may comprise an organic tin compound comprising ligands, represented by a general formula $SnL_4$ as illustrated in FIG. 2. In various embodiments, these ligands may comprise an alkyl, amine, carboxylate, or halogen. In some embodiments, some ligands may comprise an alkoxy group. All four ligands may be the same in one embodiment, but may differ in another embodiment. Exemplary tin-containing precursors include trimethyl tin chloride ($Me_3SnCl$), dimethyl tin dichloride ($Me_2SnCl_2$), methyl tin trichloride ($MeSnCl_3$), tris(dimethylamino)methyl tin(IV) (($CH_3)_2N)_3SnMe$), and (dimethylamino)trimethyl tin(IV) (($CH_3)_2N)SnMe_3$). In another embodiment, the tin-containing precursor may comprise four halogen ligands, for example, $SnCl_4$ or $SnI_4$. In various embodiments, the metal-containing precursor may be condensed with a co-reactant (e.g., an oxygen-containing precursor) to form the metalorganic film 102.

As described in the prior embodiments, an oxygen-containing precursor may be used as a co-reactant in the formation of the metalorganic film. In various embodiments, the oxygen-containing precursor may comprise a molecule having two or more reactive groups (e.g., diol), which may advantageously enable bridging more than two molecules of the metal-containing precursor and form a stable, polymeric structure on the substrate. In certain embodiments, selecting a bulky structure of the reactive groups may advantageously provide steric hindrance to each other and prevent excess condensation before a EUV lithography process.

According to one embodiment, the oxygen-containing precursor may comprise an alkenol and the deposited metalorganic film may comprise a tin alkenoxide. An alkenol is a type of a reactive structure or intermediate in organic chemistry that is represented as an alkene (olefin) with at least one hydroxy group attached to one end of the alkene double bond. The use of alkenol for the oxygen-containing precursor may advantageously incorporate a polymerizable structure in the formed metalorganic film, which may be beneficial in enhancing etch selectivity and thereby the tonality as a EUV-sensitive photoresist.

According to another embodiment, the oxygen-containing precursor may comprise an alcohol (e.g., methanol, ethanol, or isopropyl alcohol), diol (e.g., ethylene glycol), or polyol (e.g., glycerol) and the deposited metalorganic may comprise a tin alkoxide. Alkene-diols can also be used, which may be including but not limited to 3,5-cyclohexadiene-1,2-diol, 2,5-cyclohexadiene-1,4-diol, 1,3-cyclohexadiene-1,4-diol, 1,3-butadiene-1,4,-diol, cyclopenta-2,5-diene-1,2-diol, or (2Z,4E)-hepta-2,4-diene-2,6-diol.

According to yet another embodiment, the oxygen-containing precursor may comprise a phenolic compound and the deposited metalorganic film includes a tin aryloxide film. An example of the phenolic compound includes catechol, as illustrated in FIG. 2. Two hydroxy groups of catechol may advantageously react with two different molecules of the tin-containing precursor such that each catechol unit bridges units of tin oxide.

According to one embodiment, the oxygen-containing precursor may comprise a carboxylic acid and the deposited metalorganic film may comprise a tin carboxylate. In some examples, the oxygen-containing precursor may comprise an alkene moiety and either (a) at least one carboxylic acid group and at least one alcohol group, or (b) two carboxylic acid groups.

According to one embodiment, additional polymerizable species may be incorporated into the metalorganic film, where the additional polymerizable species react to form polymers in the metalorganic film. The extent of the polymerization in the metalorganic film during or after EUV exposure may be used to tailor subsequent etch characteristics of the metalorganic film. Such modifications to the metalorganic film through the additional polymerization and the resulting change in the etch characteristics may advantageously improve the tonality of the metalorganic film as EUV-sensitive photoresist. For example, in case of a negative-tone resist, the exposed region of the metalorganic film should have the etch resistance higher than the unexposed region, and the additional polymerization may further increase the etch resistance of the exposed region.

Some portions of the metalorganic film may be cross-linked by polymerizing alkene portions of the metalorganic film prior to, during, or after EUV exposure (before or after removing a portion of the film, for example, by a developing step). In certain embodiments, the cross-linking chemically joins two or more molecules in the metalorganic film by a covalent bond, and may be performed by a Diels-Alder polymerization process, a radical polymerization process, and/or a cationic polymerization process. In one or more embodiments, such polymerization processes may comprise a step of exposing the substrate to a catalyst, and may be carried out under the presence of the catalyst.

In addition, in certain embodiments, more than one type of the metal-containing precursors and more than one type of the oxygen-containing precursors may be utilized to form the metalorganic film 102. Using more than one type of the metal-containing and/or oxygen-containing precursors may advantageously allow fine tuning the overall physical and chemical properties (e.g., the bulkiness, carbon-to-oxygen ratio, and/or hydrophobicity/hydrophilicity) of the resulting metalorganic film 102 as a EUV-sensitive photoresist film.

According to one embodiment, the method further includes incorporating a photoacid generator (PAG) into the metalorganic film prior to the EUV exposure. Incorporating the PAG in a photoresist generally results in an enhanced sensitivity through chemical amplification. The PAG may release many photoacid molecules for every photon absorbed, and these photoacid molecules diffuse and react with protective groups in the backbone of the photoresist.

In one embodiment, the incorporation of the PAG may be performed by first exposing the substrate to an aluminum (Al) precursor, represented in a general chemical formula $AlL_3$, and exposing the substrate to a fluorinated alcohol (e.g., $CF_3OH$ etc.) precursor to incorporate aluminum fluoroalkoxide moieties (e.g., $Al(OCF_3)_x$ etc.) as the PAG into the metalorganic film. Thereafter, the metalorganic film is exposed to EUV radiation that generates a photoacid from the aluminum fluoroalkoxide moieties and forms crosslinks that polymerize the exposed portion of the film.

In another embodiment, the incorporation of the PAG may be performed by first exposing the substrate to a boron (B) precursor, represented in a general chemical formula $BL_3$, and exposing the substrate to a fluorinated alcohol precursor (e.g., $CF_3OH$ etc.) or a fluorinated phenol precursor (e.g., $C_6F_5OH$ etc.) to incorporate boron fluoroalkoxide (e.g., $B(OCF_3)_x$ etc.) or boron fluorophenoxide (e.g., $B(OC_6F_5)_x$ etc.) moieties as the PAG into the metalorganic film. Thereafter, the metalorganic film is exposed to EUV radiation that generates a photoacid from the boron fluoroakoxide or boron fluorophenoxide moieties and forms crosslinks that polymerize the exposed portion of the film.

FIG. 3 illustrates a processing system for depositing a metalorganic film on a substrate in accordance with one embodiment.

FIG. 3 illustrates a processing system 1 that may be configured for performing ALD or CVD processing. The processing system 1 includes a process chamber 10 having a substrate holder 20 configured to support a substrate 22, upon which a metalorganic film is deposited. The process chamber 10 further contains an upper assembly 30 (e.g., a showerhead) coupled to a precursor supply system 40 configured for supplying one or more tin-containing precursor gases. A precursor supply system 42 is configured for supplying an oxygen-containing precursor gas. The oxygen-containing precursor gas can, for example, include an alkenol, an alcohol, a diol, a phenol, a carboxylic acid, or a combination thereof. The processing system 1 further includes a purge gas supply system 44, and auxiliary gas supply systems 46, 48, and 50. The auxiliary gas supply systems 46, 48, and 50, may, for example, be used for supplying additional tin-containing precursor gases and oxygen-containing precursor gases into the process chamber 10.

Additionally, the processing system 1 includes a substrate temperature control system 60 coupled to the substrate holder 20 and configured to elevate and control the temperature of the substrate 22. The substrate temperature control system 60 contains temperature control elements, such as a cooling system including a re-circulating coolant flow that receives heat from the substrate holder 20 and transfers heat to a heat exchanger system (not shown), or when heating, transfers heat from the heat exchanger system. Additionally, the temperature control elements can include heating/cooling elements, such as resistive heating elements, or thermo-electric heaters/coolers, which can be included in the substrate holder 20, as well as the chamber wall of the process chamber 10 and any other component within the processing system 1. The substrate temperature control system 60 can, for example, be configured to elevate and control the substrate temperature from room temperature to approximately 350° C. to approximately 550° C. Alternatively, the substrate temperature can, for example, range from approximately 150° C. to approximately 350° C. It is to be understood, however, that the temperature of the substrate is selected based on the desired temperature for causing deposition of a particular metalorganic film on the surface of a given substrate.

Furthermore, the processing system 1 includes a controller 70 that can be coupled to the process chamber 10, the substrate holder 20, the upper assembly 30 configured for introducing process gases into the process chamber 10, the precursor supply systems 40 and 42, the purge gas supply system 44, the auxiliary gas supply system 46, 48, and 50, and the substrate temperature control system 6o. Alternatively, or in addition, the controller 70 can be coupled to one or more additional controllers/computers (not shown), and the controller 70 can obtain setup and/or configuration information from an additional controller/computer.

In FIG. 3, singular processing elements (10, 20, 30, 40, 42, 44, 46, 48, 5o, and 6o) are shown, but this is for example only, and the processing system 1 can include any number of processing elements having any number of controllers associated with them in addition to independent processing elements. The controller 70 can be used to configure any number of processing elements (10, 20, 30, 40, 42, 44, 46, 48, 5o, and 6o), and the controller 70 can collect, provide, process, store, and display data from processing elements. The controller 70 can comprise a number of applications for controlling one or more of the processing elements. For example, the controller 70 can include a graphic user interface (GUI) component (not shown) that can provide easy to use interfaces that enable a user to monitor and/or control one or more processing elements.

Still referring to FIG. 3, the processing system 1 may be configured to process 200 mm substrates, 300 mm substrates, 450 mm substrates, or larger-sized substrates. In fact, it is contemplated that the processing system 1 may be configured to process substrates, wafers, or LCDs regardless of their size, as would be appreciated by those skilled in the art. Therefore, while embodiments of this disclosure will be primarily described in connection with the processing of a semiconductor substrate, they are not limited solely thereto. Alternately, a batch processing system capable of processing multiple substrates simultaneously may be utilized for depositing the metalorganic film described in the embodiments of the invention.

In certain embodiments, several methods may be utilized for introducing the tin-containing precursor gas and the oxygen-containing precursor gas to the process chamber 10. One method includes vaporizing precursors through the use of separate bubblers or direct liquid injection (DLI) systems, or a combination thereof, and then mixing in the gas phase within or prior to introduction into the process chamber 10. DLI systems have been shown to reduce premature thermal decomposition of precursors over bubbling methods. By controlling the vaporization rate of each precursor separately, a desired stoichiometry can be attained within the deposited film. Another method of delivering the first and second precursors includes separately controlling two or more different liquid sources (neat precursors or precursor solutions), which are then mixed prior to entering a common vaporizer. This method may be utilized when the precursors are compatible in solution or in liquid form and they have similar vaporization characteristics. Yet another method of delivering the first and second precursor includes controlling the flow of a liquid precursor mixture (neat precursors or precursor solutions) to a common vaporizer. Other methods include the use of compatible mixed solid or liquid precursors within a bubbler. Liquid source precursors may include neat liquid precursors, or solid or liquid precursors that are dissolved in a compatible solvent. Possible compatible solvents include, but are not limited to, ionic liquids, hydrocarbons (aliphatic, olefins, and aromatic), amines, esters, glymes, crown ethers, ethers and polyethers. In some cases, it may be possible to dissolve one or more compatible solid precursors in one or more compatible liquid precursors. It will be apparent to one skilled in the art that by controlling the relative concentration levels of the first and second precursors within a gas pulse, it is possible to deposit films with desired stoichiometries.

Still referring to FIG. 3, the purge gas supply system 44 is configured to introduce a purge gas to process chamber 10. For example, the introduction of purge gas may occur between introduction of pulses of a tin-containing precursor and an oxygen-containing precursor gas to the process chamber 10. The purge gas can contain an inert gas, such as a noble gas (i.e., He, Ne, Ar, Kr, Xe), nitrogen ($N_2$), or hydrogen ($H_2$).

In order to improve the thermal transfer between the substrate 22 and the substrate holder 20, the substrate holder 20 can include a mechanical clamping system, or an electrical clamping system, such as an electrostatic clamping system, to affix the substrate 22 to an upper surface of the substrate holder 20. Furthermore, the substrate holder 20 can further include a substrate backside gas delivery system configured to introduce gas to the back-side of the substrate 22 in order to improve the gas-gap thermal conductance between the substrate 22 and the substrate holder 20. Such a system can be utilized when temperature control of the substrate is required at elevated or reduced temperatures. For example, the substrate backside gas system can contain a two-zone gas distribution system, wherein the helium gas gap pressure can be independently varied between the center and the edge of the substrate 22.

As further illustrated in FIG. 3, the process chamber 10 is further coupled to a pressure control system 32, including a vacuum pumping system 34 and a valve 36, through a duct 38, wherein the pressure control system 32 is configured to controllably evacuate the process chamber 10 to a pressure suitable for forming the metalorganic film on the substrate 22, and suitable for use of the tin-containing precursor and the oxygen-containing precursor gas. The vacuum pumping system 34 can include a turbo-molecular vacuum pump (TMP) or a cryogenic pump capable of a pumping speed up to about 5000 liters per second (and greater) and the valve 36 can include a gate valve for throttling the chamber pressure. Moreover, a device for monitoring chamber pressure (not shown) can be coupled to the process chamber 10. The pressure control system 32 can, for example, be configured to control the process chamber pressure between about 0.1 Torr and about 100 Torr during deposition of the metalorganic film.

The precursor supply systems 40 and 42, the purge gas supply system 44, the auxiliary gas supply system 46, 48, and 50, can include one or more pressure control devices, one or more flow control devices, one or more filters, one or more valves, and/or one or more flow sensors. The flow control devices can include pneumatic driven valves, electro-mechanical (solenoidal) valves, and/or high-rate pulsed gas injection valves. The gases may be sequentially and alternately pulsed into the process chamber 10, where the length of each gas pulse can, for example, be between about 0.1 sec and about 100 sec. Alternately, the length of each gas pulse can be between about 1 sec and about 10 sec. Exemplary gas pulse lengths for precursor gases can be between 0.3 and 3 sec, for example 1 sec. Exemplary gas pulse lengths for a tin-containing precursor and an oxygen-containing precursor gas can be between 0.3 and 3 sec, for example 1 sec. Exemplary purge gas pulses can be between 1 and 20 sec, for example 3 sec.

Still referring to FIG. 3, controller 70 can contain a microprocessor, memory, and a digital I/O port capable of generating control voltages sufficient to communicate and activate inputs to the processing system 1 as well as monitor outputs from the processing system 1. Moreover, the controller 70 may be coupled to and may exchange information with the process chamber 10, the substrate holder 20, the upper assembly 30, the precursor supply systems 40 and 42, the purge gas supply system 44, the auxiliary gas supply systems 46, 48, and 50, the substrate temperature control system 60, the substrate temperature control system 60, and the pressure control system 32. For example, a program stored in the memory may be utilized to activate the inputs to the aforementioned components of the processing system 1 according to a process recipe in order to perform a deposition process.

FIG. 4 illustrates a plasma processing system for depositing a metalorganic film on a substrate in accordance with another embodiment.

FIG. 4 illustrates a plasma processing system 2 that may be configured for performing PEALD or PECVD processing, in addition being able to perform ALD or CVD processing. The plasma processing system 2 is similar to the processing system 1 described in FIG. 3, but further includes a plasma generation system configured to generate a plasma during at least a portion of the gas exposures in the process chamber 10. The plasma generation system includes a first power source 52 coupled to the process chamber 10, and configured to couple power to gases introduced into the process chamber 10. The first power source 52 may be a variable power source and may include a radio frequency (RF) generator and an impedance match network, and may further include an electrode through which RF power is coupled to the plasma in the process chamber 10. The electrode can be formed in the upper assembly 31, and it can be configured to oppose the substrate holder 20. The impedance match network can be configured to optimize the transfer of RF power from the RF generator to the plasma by matching the output impedance of the match network with the input impedance of the process chamber, including the electrode, and plasma. For instance, the impedance match network serves to improve the transfer of RF power to plasma in the process chamber 10 by reducing the reflected power. Match network topologies (e.g. L-type, π-type, T-type, etc.) and automatic control methods are well known to those skilled in the art.

Alternatively, the first power source 52 may include a RF generator and an impedance match network, and may further include an antenna, such as an inductive coil, through which RF power is coupled to plasma in the process chamber 10. The antenna can, for example, include a helical or solenoidal coil, such as in an inductively coupled plasma source or helicon source, or it can, for example, include a flat coil as in a transformer coupled plasma source.

Alternatively, the first power source 52 may include a microwave frequency generator, and may further include a microwave antenna and microwave window through which microwave power is coupled to plasma in the process chamber 10. The coupling of microwave power can be accomplished using electron cyclotron resonance (ECR) technology, or it may be employed using surface wave plasma technology.

In certain embodiments, the plasma processing system 2 includes a substrate bias generation system configured to generate or assist in generating a plasma (through substrate holder biasing) during at least a portion of the alternating introduction of the gases to the process chamber 10. The substrate bias system can include a substrate power source 54 coupled to the process chamber 10, and configured to couple power to the substrate 22. The substrate power source 54 may include a RF generator and an impedance match network, and may further include an electrode through which RF power is coupled to the substrate 22. The electrode can be formed in the substrate holder 20. For instance, the substrate holder 20 can be electrically biased at a RF voltage via the transmission of RF power from a RF generator (not shown) through an impedance match network (not shown) to substrate holder 20. A typical frequency for the RF bias can range from about 0.1 MHz to about 100 MHz, and can be 13.56 MHz. RF bias systems for plasma processing are well known to those skilled in the art. Alternatively, RF power is applied to the substrate holder electrode at multiple frequencies. Although the plasma generation system and the substrate bias system are illustrated in FIG. 4 as separate entities, they may indeed contain one or more power sources coupled to substrate holder 20.

In addition, the plasma processing system 2 includes a remote plasma system 56 for providing and remotely plasma exciting gases, prior to flowing the plasma excited gas into the process chamber 10 where it is exposed to the substrate 22. The remote plasma system 56 can, for example, contain a microwave frequency generator. The process chamber pressure can be between about 0.1 Torr and about 10 Torr, or between about 0.2 Torr and about 3 Torr.

FIG. 5 illustrates a spin-on deposition system in accordance with yet another embodiment.

FIG. 5 schematically illustrates a processing system 3 for processing a substrate according to yet another embodiment. The processing system 3 may be a semi-closed spin-on deposition system similar to what the semiconductor industry currently employs for coating substrates (wafers) with photoresist layers. The semi-closed configuration allows fume control and minimizes exhaust volume. The processing system 3 contains a process chamber 310 that includes a substrate holder 312 for supporting, heating, and rotating (spinning) a substrate 302, a rotating means 318 (e.g., a motor), and a liquid delivery nozzle 314 configured for providing a processing liquid 316 to an upper surface of the substrate 302. Liquid supply systems 304, 306 and 308 supply different processing liquids to the liquid delivery nozzle 314. The different processing liquids can, for example, include a first reactant in a first liquid (e.g., a tin-containing precursor), a second reactant (e.g., an oxygen-containing precursor) in a second liquid, and a rinsing liquid. According to other embodiments, the processing system 300 may include additional liquid delivery nozzles (not shown) for providing different liquids to the substrate. Exemplary rotating speeds can be between about 500 rpm and about 1500 rpm, for example 1000 rpm, during exposure of the upper surface of the substrate 302 to the processing liquid 316.

The processing system 3 further includes a controller 320 that can be coupled to and control the process chamber 31o, the liquid supply systems 304, 306 and 308, the liquid delivery nozzle 314, the rotating means 318, means for heating the substrate holder 312. The substrate 302 may be under an inert atmosphere during the film deposition. The processing system 300 may be configured to process 200 mm substrates, 300 mm substrates, or larger-sized substrates. The processing system 300 may be configured to process substrates, wafers, or LCDs regardless of their size, as would be appreciated by those skilled in the art. Therefore, while aspects of the invention will be described in connection with the processing of a semiconductor substrate, the invention is not limited solely thereto.

The processing systems described above referring to FIGS. 3-5 are for examples only, and any other reasonable systems and configuration may be possible. For example, the plasma processing system 2 of FIG. 4 may comprise multiple spatially segregated sections within the process chamber 10, where the deposition process may be performed by moving the substrate through the spatially segregated sections using a rotatable stage.

Figure 6A:
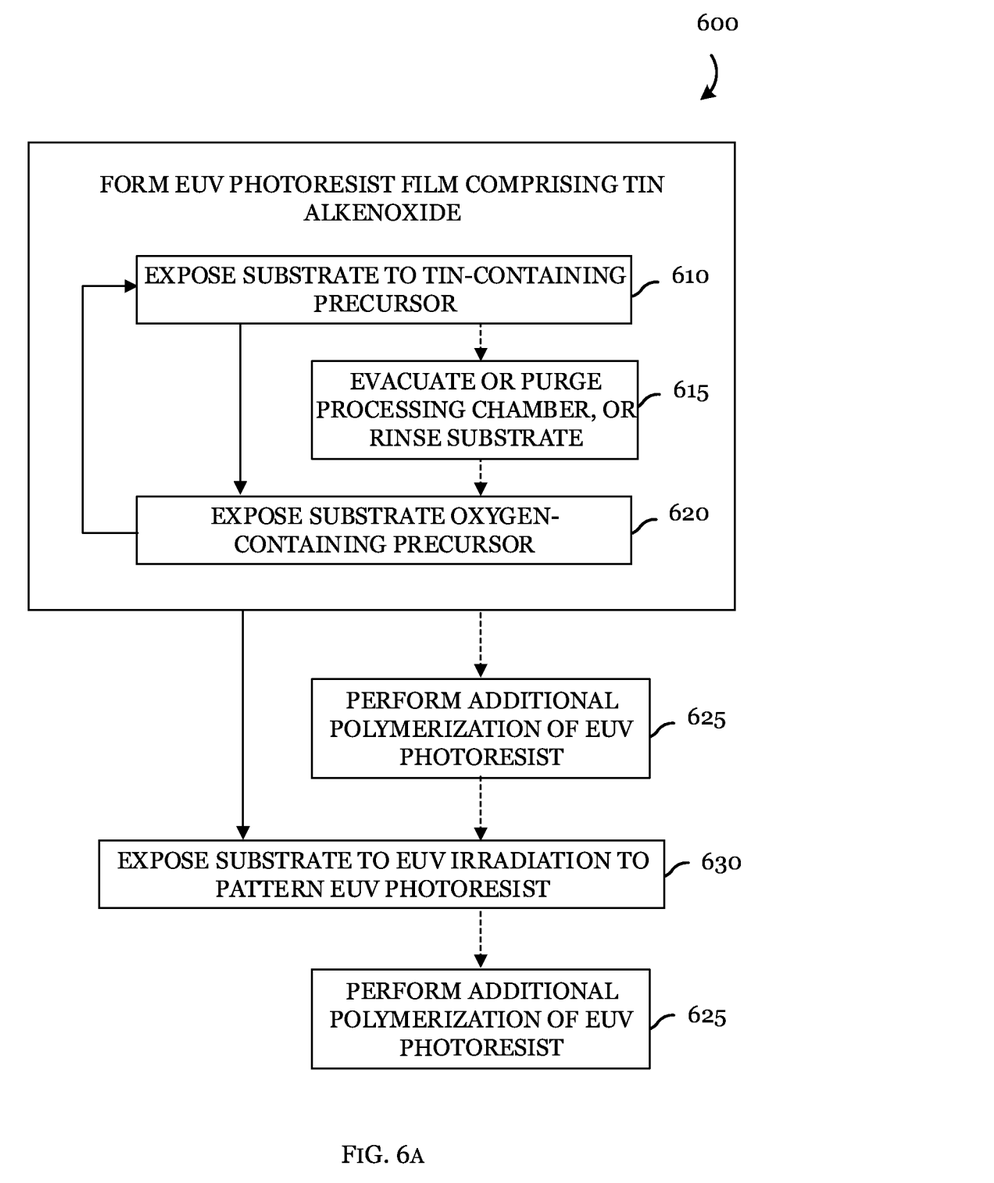
FIG. 6A illustrates some embodiment process flows.
Figure 6B:
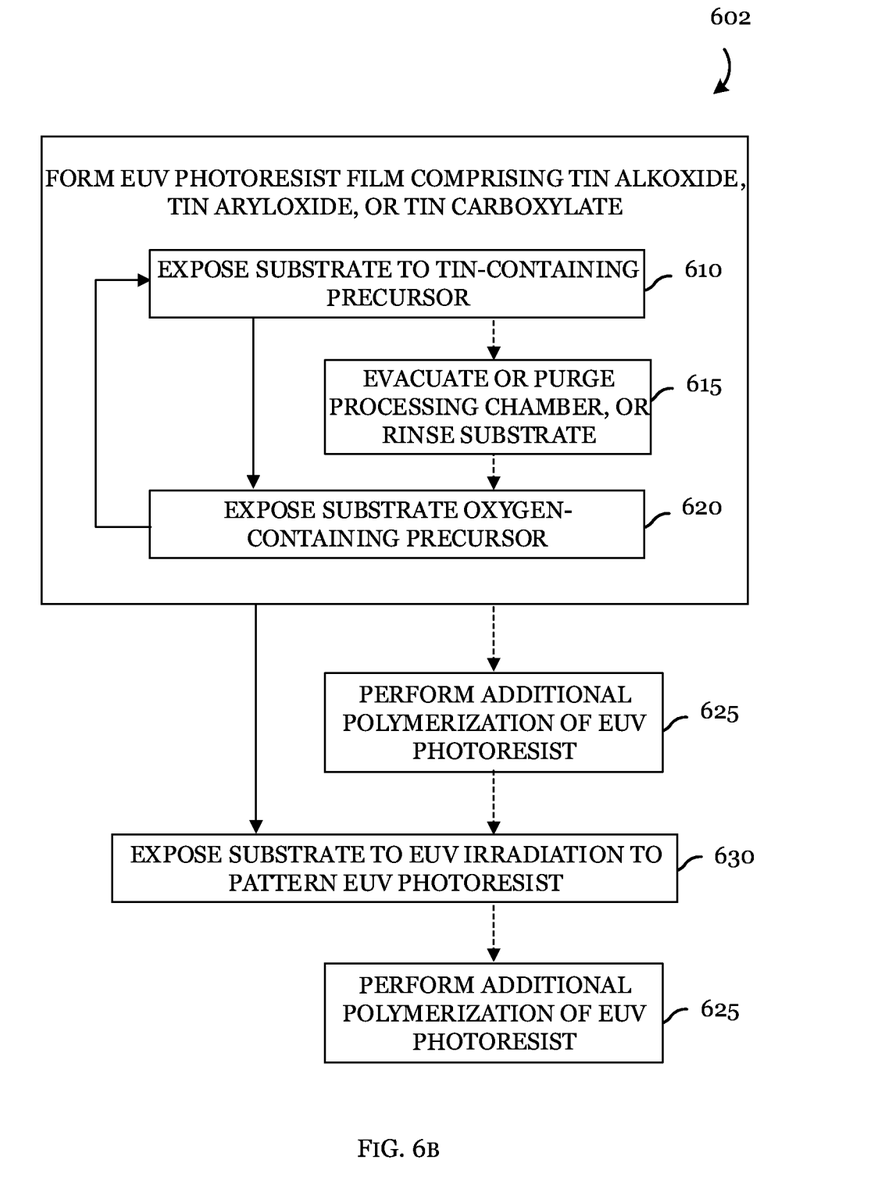
FIG. 6B illustrates alternate embodiment process flows.
Figure 6C:
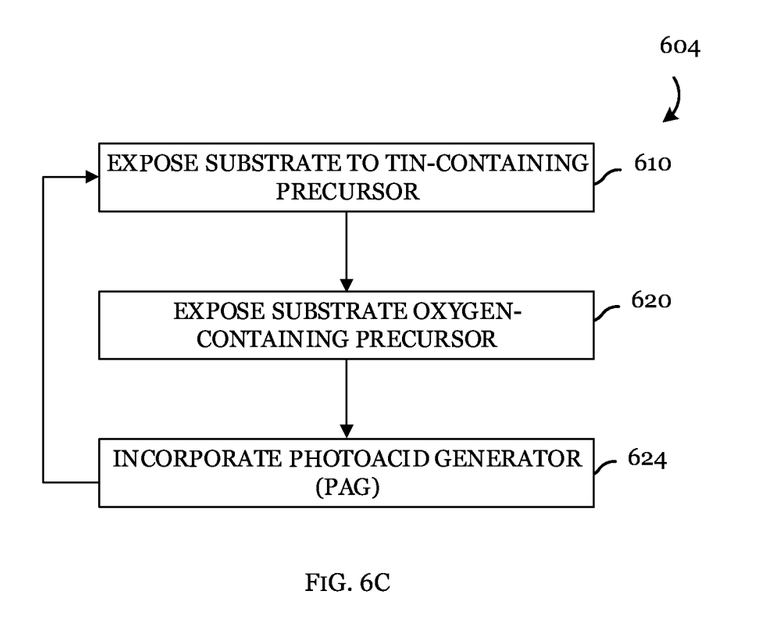
FIG. 6C illustrates yet another embodiment process flow.

FIGS. 6A-6C illustrate process flow charts of methods of formation of a EUV-active photoresist layer in accordance with various embodiments. The process flow can be followed with the figures discussed above (e.g., FIGS. 1A-1C) and hence will not be described in detail again.

In FIG. 6A, a process flow 600 may start with the formation of a EUV-sensitive photoresist film comprising tin alkenoxide (e.g., FIG. 1B) over a substrate in a process chamber by first exposing the substrate to a tin-containing precursor (block 610) and then exposing the substrate to an oxygen-containing precursor (block 620). To enable the formation of tin alkenoxide, the oxygen-containing precursor may comprise an alkenol. In various embodiments, the precursors may be gases or liquids, and accordingly the above exposing steps may be a dry or wet process. In certain embodiments, between the exposing steps, an optional intermediate step to evacuate or purge the process chamber and/or to rinse the substrate may be performed (block 615). The exposing steps, with or without the optional intermediate step, may be repeated to achieve a desired thickness of the EUV-sensitive photoresist film. When repeating the exposing steps as a part of a cyclic process, various process conditions for each step of each cycle (e.g., precursor feed rate, temperature, pressure, process time, etc.) may be the same in certain embodiments, but may be different in other embodiments. In alternate embodiments, the exposing steps may be entirely or partially overlapped in time, allowing the process to be more continuous rather than stepwise. Once the EUV-sensitive photoresist film is formed over the substrate, a EUV lithographic patterning may be performed by exposing the substrate to a EUV irradiation (block 630, e.g., FIG. 1C). In one or more embodiments, before or after the EUV exposure, an optional polymerization step may be performed to induce additional polymerization in the EUV-sensitive photoresist film for enhanced tonality (block 625). After the EUV exposure, subsequent steps such as a developing step and a pattern transfer etch process may be carried out.

In FIG. 6B, a process flow 602 is essentially the same as the process flow 60 except that the oxygen-containing precursor may has a different composition from the prior embodiments to enable the EUV-sensitive photoresist film comprising tin alkoxide, tin aryloxide, or tin carboxylate.

In FIG. 6C, a process flow 604 may start by first exposing a substrate to a tin-containing precursor (block 610) and then exposing the substrate to an oxygen-containing precursor (block 620). Further, after the EUV-sensitive photoresist film is formed, a step to incorporate a photoacid generator (PAG) may be performed (block 624). In various embodiments, the incorporation of the PAG may be achieved by exposing the substrate to PAG precursors such as a pair of an aluminum-containing precursor or a boron-containing precursor and a fluorinated alcohol precursor or a fluorinated phenol precursor. In certain embodiments, this step of incorporating the PAG may be performed simultaneously during the formation of the EUV-sensitive photoresist film. Accordingly, the exposing the substrate to the PAG precursors (block 624) may be entirely or in part overlapped with the other exposing steps (blocks bio and 620) in time.

Example embodiments of the invention are summarized here. Other embodiments can also be understood from the entirety of the specification as well as the claims filed herein.

Example 1. A method of processing a substrate that includes: forming, over the substrate placed in a process chamber, an extreme ultraviolet (EUV)-active photoresist film including a tin alkenoxide moiety by exposing the substrate to a tin-containing precursor and exposing the substrate to an oxygen-containing precursor that reacts with the tin from the tin-containing precursor to form the tin alkenoxide; and patterning the EUV-active photoresist film by exposing the substrate to an EUV irradiation.

Example 2. The method of example 1, where the tin-containing precursor and the oxygen-containing precursors are gaseous, the method further including evacuating or purging the process chamber between the exposing steps.

Example 3. The method of one of examples 1 or 2, where the tin-containing precursor and the oxygen-containing precursors are liquids, the method further including rinsing the substrate with a solvent to remove an excess amount of the tin-containing precursor or the oxygen-containing precursors between the exposing steps.

Example 4. The method of example 1, where the exposing steps overlap in time.

Example 5. The method of example 1, further including repeating the exposing steps.

Example 6. The method of one of examples 1 to 5, where the oxygen-containing precursor includes an alkenol.

Example 7. The method of one of examples 1 to 6, where the tin-containing precursor includes trimethyl tin chloride ($Me_3SnCl$), dimethyl tin dichloride ($Me_2SnCl_2$), methyl tin trichloride ($MeSnCl_3$), tris(dimethylamino)methyl tin(IV) (($(CH_3)_2N)_3SnMe$), or (dimethylamino)trimethyl tin(IV) (($(CH_3)_2N)SnMe_3$).

Example 8. The method of one of examples 1 to 7, where the patterning includes crosslinking the EUV-active photoresist film by polymerizing the alkene portion of the tin alkenoxide.

Example 9. The method of one of examples 1 to 8, where the crosslinking occurs only in an EUV exposed region of the EUV-active photoresist film during the patterning of the EUV-active photoresist film with EUV lithography.

Example 10. A method of processing a substrate that includes: forming, over the substrate placed in a process chamber, an extreme ultraviolet (EUV)-active photoresist film including a tin alkoxide, a tin aryloxide, or a tin carboxylate moiety by exposing the substrate to a tin-containing precursor and exposing the substrate to an oxygen-containing precursor that reacts with the tin from the tin-containing precursor to form the tin alkoxide, the aryloxide ligand, or the tin carboxylate; and patterning the EUV-active photoresist film by exposing the substrate to an EUV irradiation.

Example 11. The method of example 10, where the oxygen-containing precursor includes an alcohol.

Example 12. The method of one of examples 10 or 11, where the oxygen-containing precursor includes a diol.

Example 13. The method of one of examples 10 to 12, the diol is ethylene glycol.

Example 14. The method of one of examples 10 to 13, where the EUV-active photoresist film includes the tin aryloxide, and where the oxygen-containing precursor includes a phenolic compound.

Example 15. The method of one of examples 10 to 14, where the EUV-active photoresist film includes the tin carboxylate, and where the oxygen-containing precursor includes a carboxylic acid.

Example 16. The method of one of examples 10 to 15, where the EUV-active photoresist film includes the tin carboxylate, and where the oxygen-containing precursor includes an alkene moiety, a carboxylic group, and a hydroxy group.

Example 17. The method of one of examples 10 to 16, where the EUV-active photoresist film includes the tin carboxylate, and where the oxygen-containing precursor includes an alkene moiety and two carboxylic groups.

Example 18. A method of forming an extreme ultraviolet (EUV)-active photoresist film over a substrate, the method including: exposing the substrate to a tin-containing precursor; exposing the substrate to an oxygen-containing precursor to form the EUV-active photoresist film including tin and oxygen; and incorporating a photoacid generator (PAG) into the EUV-active photoresist film, where the incorporating being performed during or after forming the EUV-active photoresist film.

Example 19. The method of example 18, where the incorporating including: exposing the substrate to an aluminum (Al) precursor; and exposing the substrate to a fluorinated alcohol precursor to incorporate aluminum fluoroalkoxide moieties as the photoacid generator (PAG) into the EUV-active photoresist film.

Example 20. The method of one of examples 18 or 19, where the incorporating including: exposing the substrate to a boron (B) precursor; and exposing the substrate to a fluorinated alcohol precursor or a fluorinated phenol precursor to incorporate boron fluoroakoxide or boron fluorophenoxide moieties as the photoacid generator (PAG) into the EUV-active photoresist film.

Example 21. A substrate processing method that includes: providing a substrate in a process chamber; and forming a EUV-sensitive film on the substrate by: exposing the substrate to a tin (Sn)-containing precursor that forms an adsorbed layer on the substrate; and exposing the substrate to an oxygen-containing precursor that reacts with the adsorbed layer, where the oxygen-containing precursor includes: a) an alkenol that reacts with adsorbed layer to form a tin alkenoxide film on the substrate; b) an alcohol that reacts with adsorbed layer to form a tin alkoxide film on the substrate; c) an alcohol that reacts with adsorbed layer to form a tin alkenoxide film on the substrate; d) a diol that reacts with adsorbed layer to form a tin alkoxide film on the substrate; e) a phenol that reacts with adsorbed layer to form a tin aryloxide film on the substrate; f) a carboxylic acid that reacts with adsorbed layer to form a tin carboxylate film on the substrate; or g) an alkene moiety and either a) at least one carboxylic acid group and at least one alcohol group or b) two carboxylic acid groups, to form a tin carboxylate film on the substrate.

Example 22. The method of example 21, where the tin-containing precursor and the oxygen-containing precursors are gaseous, the method further including: evacuating, purging, or both evacuating and purging, the process chamber between the exposing steps.

Example 23. The method of one of examples 21 or 22, where the tin-containing precursor and the oxygen-containing precursors are liquids, the method further including: rinsing the substrate between the exposing steps.

Example 24. The method of one of examples 21 to 23, further including: incorporating a photoacid generator into the metal oxide film prior to EUV exposure.

Example 25. The method of one of examples 21 to 24, further including: exposing the substrate to an aluminum (Al) precursor, and exposing the substrate to a fluorinated alcohol precursor to incorporate aluminum fluoroalkoxide moieties into the metal oxide film; and exposing the metal oxide films to EUV radiation that generates a photoacid from the aluminum fluoroalkoxide moieties and forms crosslinks that polymerize the exposed portion of the metal oxide film.

Example 26. The method of one of examples 21 to 25, further including: exposing the substrate to an boron (B) precursor, and exposing the substrate to a fluorinated alcohol precursor or a fluorinated phenol precursor to incorporate boron fluoroakoxide or boron fluorophenoxide moieties into the metal oxide film; and exposing the metal oxide films to EUV radiation that generates a photoacid from the boron fluoroakoxide or boron fluorophenoxide moieties and forms crosslinks that polymerize the exposed portion of the metal oxide film.

Example 27. The method of one of examples 21 to 26, where the tin-containing precursors includes trimethyl tin chloride ($Me_3SnCl$), dimethyl tin dichloride ($Me_2SnCl_2$), methyl tin trichloride ($MeSnCl_3$), tris(dimethylamino)m- ethyl tin(IV) ((CH$_3$)$_2$N)$_3$SnMe), and (dimethylamino)trimethyl tin(IV) ((CH$_3$)$_2$N)SnMe$_3$).

Example 28. The method of one of examples 21 to 27, further including: transferring the substrate to a lithography system for EUV exposure.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of processing a substrate, the method comprising:
    forming, over the substrate placed in a process chamber, an extreme ultraviolet (EUV)-active photoresist film comprising a tin alkenoxide, a tin alkoxide, a tin aryloxide, or a tin carboxylate moiety, the forming comprising
        exposing the substrate to a tin-containing precursor, and
        exposing the substrate to an oxygen-containing precursor that reacts with tin from the tin-containing precursor to form the tin alkenoxide, the tin alkoxide, the tin aryloxide, or the tin carboxylate, wherein the tin-containing precursor and the oxygen-containing precursor comprise liquids;
    incorporating a photoacid generator (PAG) into the EUV-active photoresist film, the PAG being formed from an aluminum (Al) precursor or a boron (B) precursor, and the PAG comprising aluminum fluoroalkoxide moieties, boron fluoroalkoxide moieties, or boron fluorophenoxide moieties; and
    patterning the EUV-active photoresist film by exposing the substrate to an EUV irradiation.

2. The method of claim 1, wherein the exposing the substrate to the tin-containing precursor and the exposing the substrate to the oxygen-containing precursor are separated temporally by changing precursor composition in the process chamber or spatially by using multiple segregated sections within the process chamber.

3. The method of claim 1, further comprising rinsing the substrate with a solvent to remove an excess amount of the tin-containing precursor or the oxygen-containing precursor between the exposing steps of exposing the substrate to the tin-containing precursor and exposing the substrate to the oxygen-containing precursor.

4. The method of claim 1, wherein the exposing steps of exposing the substrate to the tin-containing precursor and exposing the substrate to the oxygen-containing precursor overlap in time.

5. The method of claim 1, further comprising repeating the exposing steps of exposing the substrate to the tin-containing precursor and exposing the substrate to the oxygen-containing precursor.

6. The method of claim 1, wherein the oxygen-containing precursor comprises an alkenol.

7. The method of claim 1, wherein the tin-containing precursor comprises trimethyl tin chloride (Me$_3$SnCl), dimethyl tin dichloride (Me$_2$SnCl$_2$), methyl tin trichloride (MeSnCl$_3$), tris(dimethylamino)methyl tin(IV) ((CH$_3$)$_2$N)$_3$SnMe), or (dimethylamino)trimethyl tin(IV) ((CH$_3$)$_2$N)SnMe$_3$).

8. The method of claim 1, wherein the patterning comprises crosslinking the EUV-active photoresist film by polymerizing an alkene portion of the tin alkenoxide.

9. The method of claim 8, wherein the crosslinking occurs only in an EUV exposed region of the EUV-active photoresist film during the patterning of the EUV-active photoresist film with EUV lithography.

10. A method of processing a substrate, the method comprising:
    forming, over the substrate placed in a process chamber, an extreme ultraviolet (EUV)-active photoresist film comprising a tin alkenoxide, a tin alkoxide, a tin aryloxide, or a tin carboxylate moiety by
        exposing the substrate to a tin-containing precursor, and
        exposing the substrate to an oxygen-containing precursor that reacts with the tin from the tin-containing precursor to form the tin alkenoxide, the tin alkoxide, the tin aryloxide, or the tin carboxylate, wherein the exposing the substrate to the tin-containing precursor and the exposing the substrate to the oxygen-containing precursor are separated temporally by changing precursor composition in the process chamber or spatially by using multiple segregated sections within the process chamber;
    incorporating a photoacid generator (PAG) into the EUV-active photoresist film, the PAG being formed from an aluminum (Al) precursor or a boron (B) precursor, and the PAG comprising aluminum fluoroalkoxide moieties, boron fluoroalkoxide moieties, or boron fluorophenoxide moieties; and
    patterning the EUV-active photoresist film by exposing the substrate to an EUV irradiation.

11. The method of claim 10, wherein the oxygen-containing precursor comprises an alcohol.

12. The method of claim 10, wherein the oxygen-containing precursor comprises a diol.

13. The method of claim 12, wherein the diol is ethylene glycol.

14. The method of claim 10, wherein the EUV-active photoresist film comprises the tin aryloxide, and wherein the oxygen-containing precursor comprises a phenolic compound.

15. The method of claim 10, wherein the EUV-active photoresist film comprises the tin carboxylate, and wherein the oxygen-containing precursor comprises a carboxylic acid.

16. The method of claim 10, wherein the EUV-active photoresist film comprises the tin carboxylate, and wherein the oxygen-containing precursor comprises an alkene moiety, a carboxylic group, and a hydroxy group.

17. The method of claim 10, wherein the EUV-active photoresist film comprises the tin carboxylate, and wherein the oxygen-containing precursor comprises an alkene moiety and two carboxylic groups.

18. A method of forming an extreme ultraviolet (EUV)-active photoresist film over a substrate, the method comprising:
    exposing the substrate to a tin-containing precursor;
    exposing the substrate to an oxygen-containing precursor to form the EUV-active photoresist film comprising tin and oxygen; and
    incorporating a photoacid generator (PAG) into the EUV-active photoresist film by
        exposing the substrate to an aluminum (Al) precursor or a boron (B) precursor, and exposing the substrate to a fluorinated alcohol precursor or a fluorinated phenol precursor to incorporate aluminum fluoroalkoxide moieties, boron fluoroalkoxide moieties, or boron fluorophenoxide moieties as the photoacid generator (PAG) into the EUV-active photoresist film, wherein the incorporating is performed during or after forming the EUV-active photoresist film.

19. The method of claim 18, wherein the incorporating comprises:
exposing the substrate to the aluminum (Al) precursor; and
exposing the substrate to the fluorinated alcohol precursor to incorporate aluminum fluoroalkoxide moieties as the photoacid generator (PAG) into the EUV-active photoresist film.

20. The method of claim 18, wherein the incorporating comprises:
exposing the substrate to the boron (B) precursor; and
exposing the substrate to the fluorinated alcohol precursor or the fluorinated phenol precursor to incorporate boron fluoroalkoxide or boron fluorophenoxide moieties as the photoacid generator (PAG) into the EUV-active photoresist film.

* * * * *